United States Patent
Ajuria et al.

(10) Patent No.: US 9,134,366 B2
(45) Date of Patent: Sep. 15, 2015

(54) METHOD FOR FORMING A PACKAGED SEMICONDUCTOR DEVICE

(71) Applicants: Sergio A. Ajuria, Austin, TX (US);
Phuc M. Nguyen, Austin, TX (US);
Douglas M. Reber, Austin, TX (US)

(72) Inventors: Sergio A. Ajuria, Austin, TX (US);
Phuc M. Nguyen, Austin, TX (US);
Douglas M. Reber, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 269 days.

(21) Appl. No.: 14/011,160

(22) Filed: Aug. 27, 2013

(65) Prior Publication Data
US 2015/0061709 A1    Mar. 5, 2015

(51) Int. Cl.
*H01L 21/66* (2006.01)
*G01R 31/28* (2006.01)
*H01L 23/522* (2006.01)

(52) U.S. Cl.
CPC ............ *G01R 31/2884* (2013.01); *H01L 22/32* (2013.01); *H01L 23/5226* (2013.01); *G01R 31/2896* (2013.01)

(58) Field of Classification Search
CPC .................. H01L 21/823475; H01L 24/43
USPC .................................................. 438/114, 617
See application file for complete search history.

(56) References Cited

U.S. PATENT DOCUMENTS

| | | | |
|---|---|---|---|
| 4,701,781 A | 10/1987 | Sankhagowit | |
| 5,334,857 A | 8/1994 | Mennitt et al. | |
| 6,607,937 B1 * | 8/2003 | Corisis | 438/108 |
| 7,476,563 B2 | 1/2009 | Mangrum et al. | |
| 7,863,721 B2 * | 1/2011 | Suthiwongsunthorn et al. | 257/686 |
| 2012/0273782 A1 | 11/2012 | Goel et al. | |
| 2012/0305916 A1 | 12/2012 | Liu et al. | |
| 2012/0326246 A1 | 12/2012 | Iwasaki et al. | |

* cited by examiner

*Primary Examiner* — Chandra Chaudhari

(57) ABSTRACT

A method of fabricating a packaged semiconductor device includes integrating a plurality of singulated semiconductor die in a die carrier, and forming one or more interconnect layers on the die carrier. The interconnect layers include at least one of conductive intra-layer structures and inter-layer structures coupled to contact pads on the plurality of singulated semiconductor die. A set of landing pads is formed coupled to a first subset of the contact pads via a first set of the conductive intra-layer structures and inter-layer structures. A set of probe pads is formed coupled to a second subset of the contact pads via a second set of the conductive intra-layer structures and inter-layer structures. The die carrier is singulated to form a plurality of packaged semiconductor devices. The set of probe pads is removed during the singulating the die carrier.

20 Claims, 4 Drawing Sheets

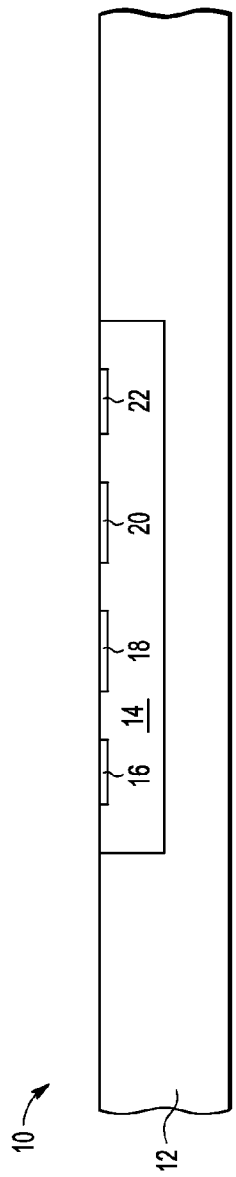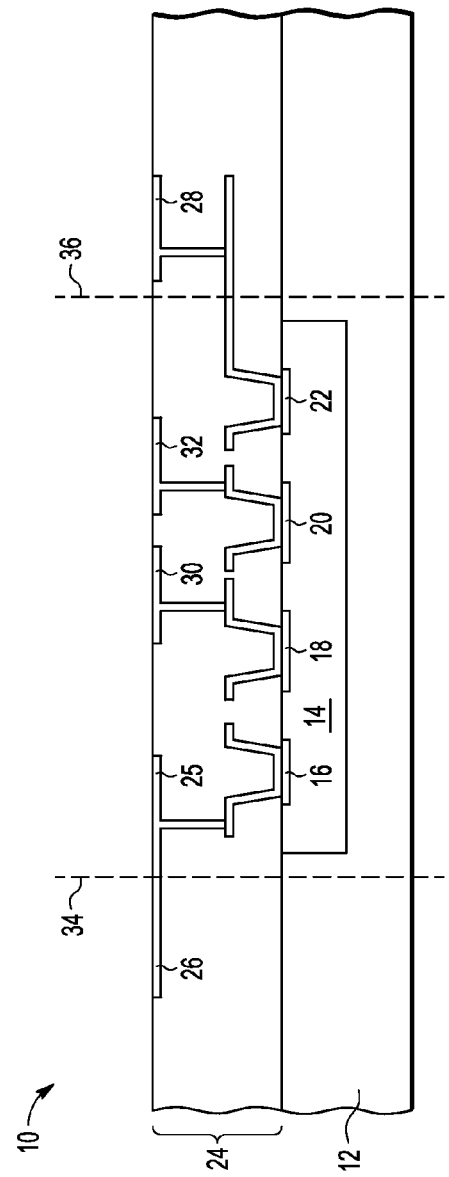

METHOD FOR FORMING A PACKAGED SEMICONDUCTOR DEVICE

BACKGROUND

1. Field

This disclosure relates generally to semiconductor processing, and more specifically, to a method for forming a packaged semiconductor device.

2. Related Art

Packaged semiconductor devices contain a number of pins in order to for the semiconductor device to communicate with a printed circuit board. These packages may include "test only" pins which are intended for debug and other internal-use monitoring only. These test only pins may include, for example, Process Optimization Structure (POSt) pins, Dual Data Rate (DDR) test point pins, and analog test point pins. Typically, upon connecting these packaged semiconductor devices to printed circuit boards, these test only pins are grounded. However, even though they may be grounded, in order to ensure proper operation of the semiconductor device, these test only pins must still achieve the same qualification standards as other pins on the device, such as electro-static discharge robustness. Furthermore, these test only pins add to the pin count and require additional die area, which is undesirable, especially as semiconductor devices continue to decrease in size.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates a cross-sectional view of a semiconductor device at a stage in processing in accordance with one embodiment of the present invention.

FIG. 2 illustrates a cross-sectional view of the semiconductor device of FIG. 1 at a subsequent stage in processing in accordance with one embodiment of the present invention.

DETAILED DESCRIPTION

Figure 3:
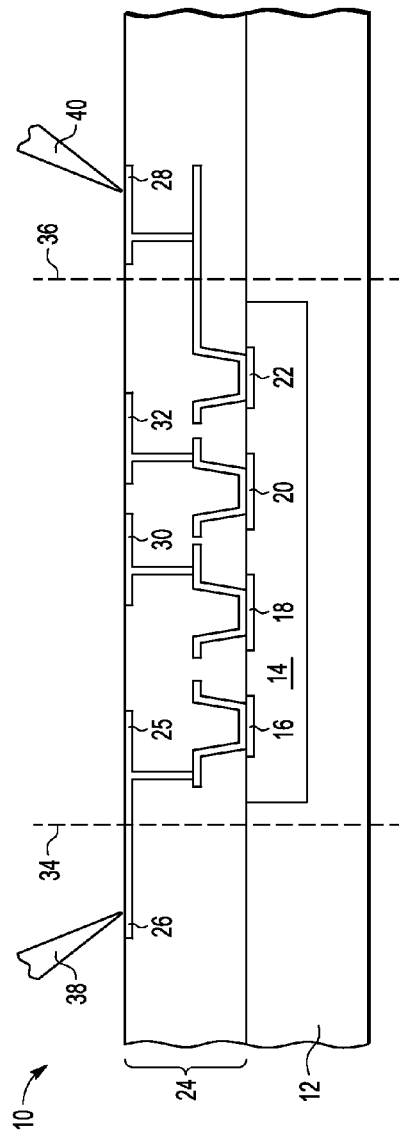
FIG. 3 illustrates a cross-sectional view of the semiconductor device of FIG. 2 at a subsequent stage in processing in accordance with one embodiment of the present invention.

Test only pins are typically used during fabrication of a packaged semiconductor device to perform debug or internal-monitoring of the semiconductor die. These test only pins correspond to testing probe pads which allow probing of the semiconductor die. In one embodiment, a plurality of semiconductor die which were singulated from a semiconductor wafer are embedded into a die carrier. One or more interconnect layers may then be formed on the die carrier which provide electrical connections from the semiconductor die to both landing pads and testing probe pads. The testing probe pads are placed outside the singulation lines of the die carrier such that when the die carrier is singulated into a plurality of packaged semiconductor devices, the testing probe pads are removed during the singulation. In this manner, the resulting plurality of packaged semiconductor devices include contact pads but do not include the testing probe pads and thus test only pins are eliminated from the packaged device.

FIG. 1 illustrates a cross-sectional view of a semiconductor device 10 in accordance with an embodiment of the present invention. Device 10 includes a die carrier 12 having a plurality of singulated semiconductor die embedded or integrated within die carrier 12. FIG. 1 illustrates one of the plurality of embedded semiconductor die, semiconductor die 14, that is embedded within die carrier 12. The embedded semiconductor die, such as semiconductor die 14, are die which have been singulated from a semiconductor wafer, and, in one embodiment, tested to be known good die prior to being embedded into die carrier 12. Semiconductor die 14 includes a plurality of contact pads, such as contact pads 16, 18, 20, and 22, at a surface of semiconductor die 14. These contact pads may provide electrical connections to circuitry within die 14 and/or to other contact pads of die 14. Die 14 is embedded in die carrier 12 such that contact pads 16, 18, 20, and 22 are exposed. Note that each of the plurality of semiconductor die embedded in die carrier 12 may include any number of contact pads which are exposed. Also, each of the plurality of semiconductor die embedded in die carrier 12 may be a same type of semiconductor die or may be one or more different types of semiconductor die.

In one embodiment, die carrier 12 and the embedded semiconductor die are formed using a redistributed chip package (RCP) technology. In this embodiment, the singulated die are placed face-down on an adhesive tape which is mounted over a support carrier. A mold frame is placed around the singulated die and a resin or encapsulant is formed over the die. The frame is subsequently removed. (Note that the mold frame may include one or more openings, and each opening may include one or more singulated die.) Therefore, in this embodiment, die carrier 12 includes a resin such that the semiconductor die, such as die 14, are embedded within a resin.

In an alternate embodiment, die carrier 12 and the embedded semiconductor die are formed using Chip in Wafer Integrated System (CIWIS) technology. In this embodiment, a wafer (e.g., a semiconductor wafer) may be etched to form a plurality of cavities or openings. A singulated die may then be placed within each cavity or opening. In the case of cavities, an adhesive may be used to hold the singulated die in place in each cavity. In the case of openings, a support carrier may be used to support the wafer with openings, and a semiconductor die can be placed within each opening. After the placement of the singulated die within the cavities or openings, a non-conductive fill material (e.g. a molding material) may be formed within the cavities or openings. A patterned etch may then be performed on the fill material to expose the contact pads.

FIG. 2 illustrates a cross-sectional view of semiconductor device 10 after formation of a plurality of interconnect layers 24 over die carrier 12. Interconnect layers include landing pads 25, 30, and 32 and testing probe pads 26 and 28 at an exposed surface of interconnect layers 24. Note that testing probe pads 26 and 28 may also be referred to as probe pads. Interconnect layers 24 may include one or more interconnect layers, in which each layer may include any number of interlayer and intralayer conductive portions (or structures) used to electrically route connections between layers of interconnect layers 24 and/or within layers of interconnect layers 24. Therefore, interconnect layers 24 includes any number of conductive interconnect structures which electrically connect any of contact pads 16, 18, 20, and 22 to a landing pad or testing probe pad of interconnect layers 24. These conductive structures are formed with the interlayer and intralayer conductive portions of interconnect layers 24. Note that multiple contact pads may be connected to a single landing pad or testing probe pad. In one embodiment, a set of landing pads (such as, for example, landing pads 30 and 32) is coupled to a first subset of contact pads (such as, for example, any subset of contacts pads 16, 18, 20, and 22) via a first subset of conductive interconnect structures within interconnect layers 24, and a set of probe pads (such as, for example, probe pads 26 and 28) is coupled to a second subset of contact pads (such as, for example, any subset of contact pads 16, 18, 20, and 22) via a second subset of conductive interconnect structures within interconnect layers 24. Note that the first subset and second subset of contact pads may be overlapping, as may the first and second subsets of conductive interconnect structures.

Also illustrated in FIG. 2 are singulation lines 34 and 36. During singulation, semiconductor device 10 will be singulated along lines 34 and 36 such that elements outside of 34 and 36 (and outside the singulation lines of neighboring embedded die) are removed. Therefore, the region located between singulation lines 34 and 36 will remains as part of the packaged semiconductor device which includes die 14.

FIG. 3 illustrates a cross-sectional view of semiconductor device 10 after testing semiconductor die 14. Probe needles 38 and 40 of a probe tester may be used to probe semiconductor die 14 using testing probe pads 26 and 28. Therefore, testing may be performed on semiconductor die 14 while embedded within die carrier 12.

Figure 4:
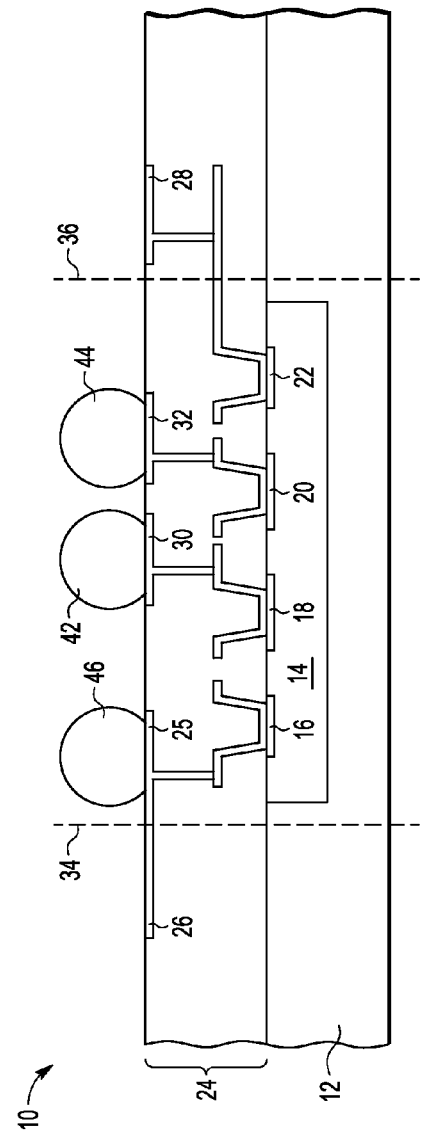
FIG. 4 illustrates a cross-sectional view of the semiconductor device of FIG. 4 at a subsequent stage in processing in accordance with one embodiment of the present invention.

FIG. 4 illustrates a cross-sectional view of semiconductor device 10 after forming conductive balls on interconnect layers 24. Conductive ball 42 is formed on landing pad 30 and conductive ball 44 is formed on landing pad 32. Therefore, in one embodiment, a conductive ball is formed on each landing pad of interconnect layers 24. In one embodiment, conductive balls 42 and 44, along with other conductive balls formed on interconnect layers 24, may form a ball grid array. In the illustrated embodiment, although testing probe pads 26 and 28 are located outside of singulation lines 34 and 36, a portion of the interconnect structure which connects the testing probe pads to a contact pad of die 14 may be exposed at the surface of interconnect layers 24. For example, trace 25, which is part of the interconnect structure which connects probe pad 26 to contact pad 16, is exposed, and a conductive ball 46 may be formed on this trace. Therefore, in the illustrated embodiment, trace 25 may also be referred to as landing pad 25 in which conductive ball 46 is formed on landing pad 25. Note that landing pad 25 is electrically connected to probe pad 26 and contact pad 16.

Figure 5:
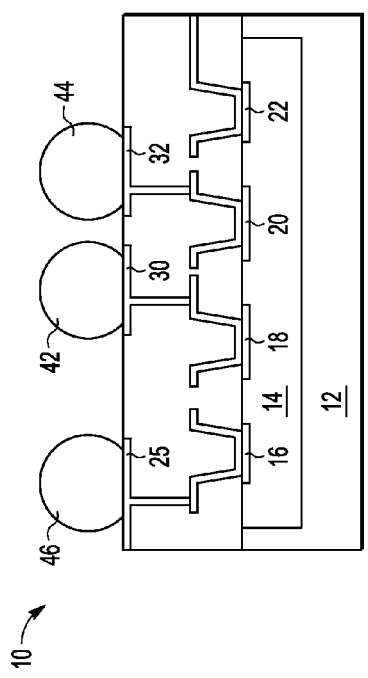
FIG. 5 illustrates a cross-sectional view of the semiconductor device of FIG. 4 after singulation in accordance with one embodiment of the present invention.

FIG. 5 illustrates a cross-sectional view of semiconductor device 10 after singulation of carrier 12 in which cuts are performed along singulation lines, such as singulation lines 34 and 36. Upon singulation, a plurality of packaged semiconductor devices are formed, such as the packaged semiconductor device illustrated in FIG. 5. The packaged semiconductor device of FIG. 5 includes die 14. Note that each packaged semiconductor device that is singulated from die carrier 12 may include any number of singulated semiconductor die embedded in the singulated portion of die carrier 12.

Figure 6:
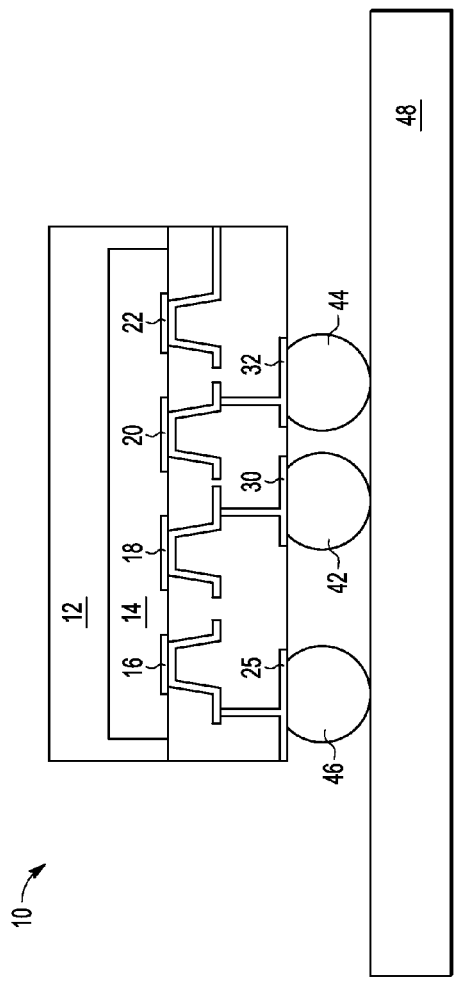
FIG. 6 illustrates a cross-sectional view of the semiconductor device of FIG. 5 after attachment to a printed circuit board (PCB) in accordance with one embodiment of the present invention.

FIG. 6 illustrates a cross-sectional view of semiconductor device 10 after connecting semiconductor device 10 to a printed circuit board (PCB) 48. Therefore, electrical connections are made between the contact pads of die 14 to traces of PCB 48 by way of conductive balls 46, 42, and 44. In one embodiment, conductive ball 46 is grounded which protects access to contact pad 16. In alternate embodiments, rather than being connect to PCB 48, semiconductor device 10 can be connected to another die or to an interposer substrate which contains multiple die. Also, in alternate embodiments, different electrically conductive elements, rather than conductive balls, may be formed. For example, instead of conductive balls 46, 42, and 44, wire bonds may be used to provide electrical connections from device 10 to a PCB, interposer substrate, or other die. Also, semiconductor device 10 can be oriented in different directions, as needed, to make the electrical connections.

Figure 7:
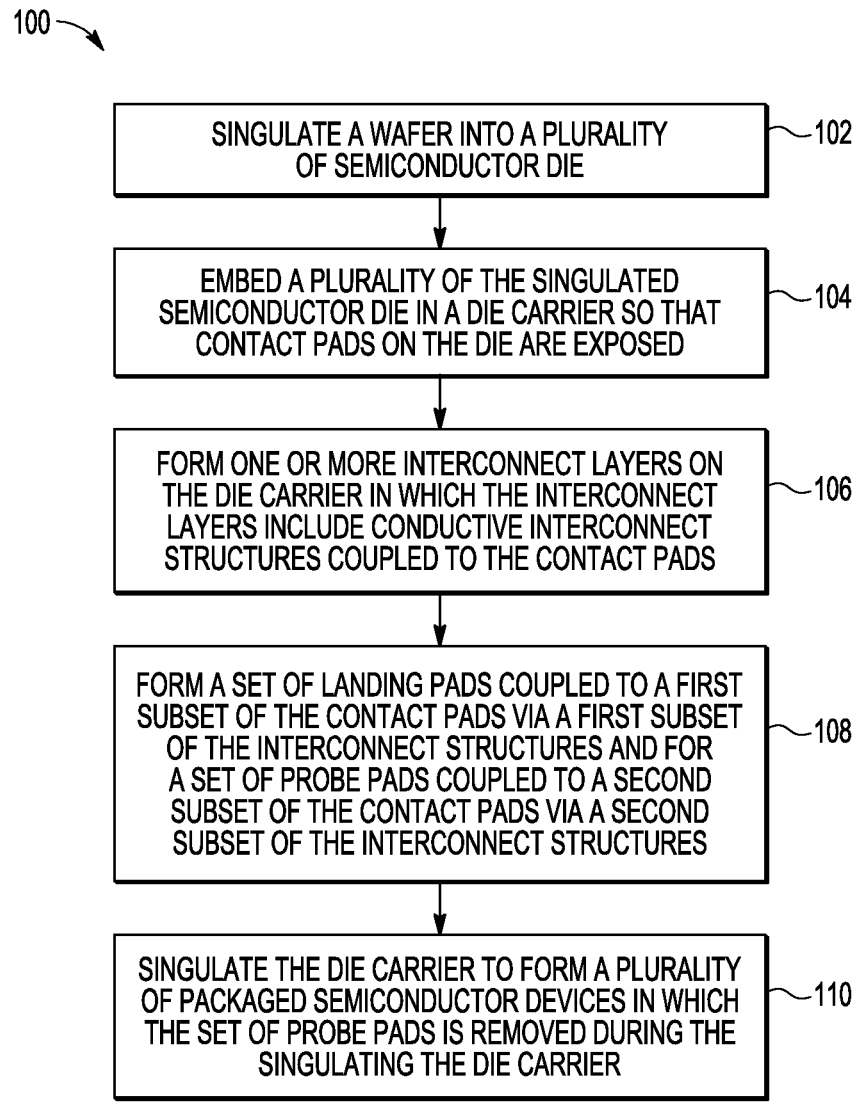
FIG. 7 illustrates, in flow diagram form, a method for forming a packaged semiconductor device, in accordance with one embodiment of the present invention.

FIG. 7 illustrates, in flow diagram form, a method for forming a packaged semiconductor device in accordance with an embodiment of the present invention. Method 100 begins with block 102 in which a wafer is singulated into a plurality of semiconductor die, such as die 14 described above in reference to FIG. 1. Method 100 continues to block 104 in which a plurality of singulated semiconductor die are embedded or integrated into a die carrier (such as die carrier 12) so that contact pads (such as contact pads 16, 18, 20, and 22) are exposed. Method 100 continues with block 106 in which one or more interconnect layers (such as interconnect layers 24) are formed on the die carrier, in which the interconnect layer include conductive interconnect structures coupled to the contact pads. Method 100 continues with block 108 in which a set of landing pads (such as landing pads 30 and 32) is coupled to a first subset of the contact pads via a first subset of the interconnect structures, and a set of probe pads (such as probe pads 26 and 28) is coupled to a second subset of the contact pads via a second subset of the interconnect structures. Method 100 continues with block 110 in which the die carrier is singulated to form a plurality of packaged semiconductor devices (such as the device of FIG. 5 which may or may not include conductive balls 42, 44, and 46, or which may include other conductive elements connected to the landing pads) in which the set of probe pads is removed during the singulating of the die carrier.

By now it should be appreciated that there has been provided a method for forming a packaged semiconductor device which can be probed during fabrication but which eliminates any test only pins on the packaged device. That is, test probe pads can be formed outside of the singulation area of a die such that probing may be performed during fabrication. However, upon singulation, the test probe pads are removed and do not remain as part of the final packaged semiconductor device. In this manner, unlike test only pins, the test probe pads need not achieve the same qualification standards as other pins. Pin counts are also reduced. Furthermore, by removing test only pins, misuse of test only pins to access the device can be reduced.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the die carrier can be formed in a variety of different ways to include one or more singulated semiconductor die. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a packaged semiconductor device, in which the method includes singulating a wafer into a plurality of semiconductor die; embedding a plurality of the singulated semiconductor die in a die carrier so that contact pads on the die are exposed; forming one or more interconnect layers on the die carrier, wherein the interconnect layers include conductive interconnect structures coupled to the contact pads; forming a set of landing pads coupled to a first subset of the contact pads via a first subset of the interconnect structures; forming a set of probe pads coupled to a second subset of the contact pads via a second subset of the interconnect structures; and singulating the die carrier to form a plurality of packaged semiconductor devices, wherein the set of probe pads is removed during the singulating the die carrier. Item 2 includes the method of item 1, wherein the embedding the plurality of the singulated semiconductor die includes placing one or more of the plurality of singulated semiconductor die on the die carrier; placing a mold frame having one or more openings around the one or more of the plurality of singulated semiconductor die; depositing resin in the one or more openings; and removing the mold frame. Item 3 includes the method of item 1, wherein the embedding the plurality of the singulated semiconductor die includes placing one or more of the plurality of singulated semiconductor die in corresponding cavities in the die carrier, wherein the die carrier is a semiconductor wafer. Item 4 includes the method of item 3, wherein the one or more of the plurality of singulated semiconductor die are held in the cavities with an adhesive. Item 5 includes the method of item 1, and further includes forming an array of conductive balls on the landing pads. Item 6 includes the method of item 1, and further includes testing the plurality of the semiconductor die using the set of probe pads before the singulating the die carrier. Item 7 includes the method of item 1, wherein the packaged semiconductor device is one of a group consisting of: a redistributed chip package and a Chip In Wafer for Integrated System package. Item 8 includes the method of item 1, and further includes forming electrically conductive elements on the landing pads; attaching the electrically conductive elements to one of a group consisting of: an interposer, another semiconductor die, and a printed circuit board.

Item 9 includes a method of fabricating a packaged semiconductor device which includes integrating a plurality of singulated semiconductor die in a die carrier; forming one or more interconnect layers on the die carrier, wherein the interconnect layers include at least one of conductive intra-layer structures and inter-layer structures coupled to contact pads on the singulated semiconductor die; forming a set of landing pads coupled to a first subset of the contact pads via a first set of the conductive intra-layer structures and inter-layer structures; forming a set of probe pads coupled to a second subset of the contact pads via a second set of the conductive intra-layer structures and inter-layer structures; and singulating the die carrier to form a plurality of packaged semiconductor devices, wherein the set of probe pads is removed during the singulating the die carrier. Item 10 includes the method of item 9, wherein the integrating the plurality of singulated semiconductor die includes placing the plurality of singulated semiconductor die on the die carrier; placing a mold frame having one or more openings around the plurality of singulated semiconductor die; depositing an encapsulant in the one or more openings; and removing the mold frame. Item 11 includes the method of item 9, wherein the integrating the plurality of the singulated semiconductor die includes placing the plurality of singulated semiconductor die in respective cavities in the die carrier. Item 12 includes the method of item 11, wherein the plurality of singulated semiconductor die are held on the die carrier with an adhesive. Item 13 includes the method of item 12, wherein the die carrier is a semiconductor wafer. Item 14 includes the method of item 9, and further includes forming a ball grid array on the landing pads. Item 15 includes the method of item 9, and further includes testing the plurality of singulated semiconductor die using the set of probe pads before the singulating the die carrier. Item 16 includes the method of item 10, wherein the packaged semiconductor device is one of a group consisting of a redistributed chip package and a Chip In Wafer for Integrated System package. Item 17 includes the method of item 9, and further includes forming electrically conductive elements on the landing pads before the singulating the die carrier; attaching the electrically conductive elements to one of a group consisting of: an interposer substrate, another semiconductor die, and a printed circuit board. Item 16 includes the method of item 9, wherein a first subset of the plurality of singulated semiconductor die perform a different function than a second subset of the plurality of singulated semiconductor die.

Item 19 includes a method of forming a redistributed chip package which includes attaching a plurality of singulated semiconductor chips to a wafer; encapsulating the singulated semiconductor chips; forming one or more interconnect layers including conductive interconnect members coupled to contact pads on the singulated semiconductor chips, wherein one of the interconnect layers include landing pads and probe pads; testing the singulated semiconductor chips using the probe pads; singulating the wafer to form a plurality of redistributed chip packages, wherein the probe pads are removed during the singulating. Item 20 includes the method of item 19, and further includes forming electrically conductive elements on the landing pads before the singulating; attaching the electrically conductive elements to one of a group consisting of: an interposer, at least one other semiconductor chip, and a printed circuit board.

What is claimed is:

1. A method of forming a packaged semiconductor device, comprising:
   singulating a wafer into a plurality of semiconductor die;
   embedding a plurality of the singulated semiconductor die in a die carrier so that contact pads on the die are exposed;
   forming one or more interconnect layers on the die carrier, wherein the interconnect layers include conductive interconnect structures coupled to the contact pads;
   forming a set of landing pads coupled to a first subset of the contact pads via a first subset of the interconnect structures;
   forming a set of probe pads coupled to a second subset of the contact pads via a second subset of the interconnect structures; and
   singulating the die carrier to form a plurality of packaged semiconductor devices, wherein the set of probe pads is removed during the singulating the die carrier.

2. The method of claim 1, wherein the embedding the plurality of the singulated semiconductor die comprises:
   placing one or more of the plurality of singulated semiconductor die on the die carrier;
   placing a mold frame having one or more openings around the one or more of the plurality of singulated semiconductor die;
   depositing resin in the one or more openings; and
   removing the mold frame.

3. The method of claim 1, wherein the embedding the plurality of the singulated semiconductor die comprises:
   placing one or more of the plurality of singulated semiconductor die in corresponding cavities in the die carrier, wherein the die carrier is a semiconductor wafer.

4. The method of claim 3 wherein the one or more of the plurality of singulated semiconductor die are held in the cavities with an adhesive.

5. The method of claim 1 further comprising:
   forming an array of conductive balls on the landing pads.

6. The method of claim 1 further comprising:
   testing the plurality of the semiconductor die using the set of probe pads before the singulating the die carrier.

7. The method of claim 1 wherein the packaged semiconductor device is one of a group consisting of: a redistributed chip package and a Chip In Wafer for Integrated System package.

8. The method of claim 1 further comprising:
   forming electrically conductive elements on the landing pads;
   attaching the electrically conductive elements to one of a group consisting of: an interposer, another semiconductor die, and a printed circuit board.

9. A method of fabricating a packaged semiconductor device comprising:
   integrating a plurality of singulated semiconductor die in a die carrier;
   forming one or more interconnect layers on the die carrier, wherein the interconnect layers include at least one of conductive intra-layer structures and inter-layer structures coupled to contact pads on the singulated semiconductor die;
   forming a set of landing pads coupled to a first subset of the contact pads via a first set of the conductive intra-layer structures and inter-layer structures;
   forming a set of probe pads coupled to a second subset of the contact pads via a second set of the conductive intra-layer structures and inter-layer structures; and
   singulating the die carrier to form a plurality of packaged semiconductor devices, wherein the set of probe pads is removed during the singulating the die carrier.

10. The method of claim 9, wherein the integrating the plurality of singulated semiconductor die comprises:
    placing the plurality of singulated semiconductor die on the die carrier;
    placing a mold frame having one or more openings around the plurality of singulated semiconductor die;
    depositing an encapsulant in the one or more openings; and
    removing the mold frame.

11. The method of claim 9, wherein the integrating the plurality of the singulated semiconductor die comprises:
    placing the plurality of singulated semiconductor die in respective cavities in the die carrier.

12. The method of claim 11 wherein the plurality of singulated semiconductor die are held on the die carrier with an adhesive.

13. The method of claim 12, wherein the die carrier is a semiconductor wafer.

14. The method of claim 9 further comprising:
    forming a ball grid array on the landing pads.

15. The method of claim 9 further comprising:
    testing the plurality of singulated semiconductor die using the set of probe pads before the singulating the die carrier.

16. The method of claim 10 wherein the packaged semiconductor device is one of a group consisting of a redistributed chip package and a Chip In Wafer for Integrated System package.

17. The method of claim 9 further comprising:
    forming electrically conductive elements on the landing pads before the singulating the die carrier;
    attaching the electrically conductive elements to one of a group consisting of: an interposer substrate, another semiconductor die, and a printed circuit board.

18. The method of claim 9 wherein a first subset of the plurality of singulated semiconductor die perform a different function than a second subset of the plurality of singulated semiconductor die.

19. A method of forming a redistributed chip package comprising:
    attaching a plurality of singulated semiconductor chips to a wafer;
    encapsulating the singulated semiconductor chips;
    forming one or more interconnect layers including conductive interconnect members coupled to contact pads on the singulated semiconductor chips, wherein one of the interconnect layers include landing pads and probe pads;
    testing the singulated semiconductor chips using the probe pads;
    singulating the wafer to form a plurality of redistributed chip packages, wherein the probe pads are removed during the singulating.

20. The method of claim 19 further comprising:
forming electrically conductive elements on the landing pads before the singulating;
attaching the electrically conductive elements to one of a group consisting of: an interposer, at least one other semiconductor chip, and a printed circuit board.

* * * * *